(12) United States Patent
Huang

(10) Patent No.: US 11,398,506 B2
(45) Date of Patent: Jul. 26, 2022

(54) TFT ARRAY SUBSTRATE, FABRICATING METHOD THEREOF, AND DISPLAY PANEL THEREOF

(71) Applicant: Wuhan China Star Optoelectronics Semiconductor Display Technology Co., Ltd., Hubei (CN)

(72) Inventor: Qian Huang, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 257 days.

(21) Appl. No.: 16/624,789

(22) PCT Filed: Oct. 18, 2019

(86) PCT No.: PCT/CN2019/111900
§ 371 (c)(1),
(2) Date: Dec. 19, 2019

(87) PCT Pub. No.: WO2021/012425
PCT Pub. Date: Jan. 28, 2021

(65) Prior Publication Data
US 2021/0366951 A1 Nov. 25, 2021

(30) Foreign Application Priority Data
Jul. 23, 2019 (CN) .......................... 201910663797.6

(51) Int. Cl.
*H01L 27/12* (2006.01)

(52) U.S. Cl.
CPC ...... *H01L 27/1248* (2013.01); *H01L 27/1259* (2013.01)

(58) Field of Classification Search
None
See application file for complete search history.

(56) References Cited

U.S. PATENT DOCUMENTS

| 10,236,316 | B2 | 3/2019 | Sagawa |
| 2019/0131368 | A1 | 5/2019 | Zhang et al. |
| 2019/0172859 | A1* | 6/2019 | Sagawa ............... H01L 27/3276 |
| 2019/0393289 | A1 | 12/2019 | Hu |

(Continued)

FOREIGN PATENT DOCUMENTS

| CN | 206773356 U | 12/2017 |
| CN | 107658333 A | 2/2018 |

(Continued)

*Primary Examiner* — Bo B Jang
(74) *Attorney, Agent, or Firm* — Geoffrey A. Lottenberg; Berger Singerman LLP

(57) ABSTRACT

The present invention provides a thin film transistor (TFT) array substrate including a base layer. A function layer is disposed on the base layer, and a planarization layer is disposed on the function layer. The planarization layer includes a vertical insertion extending into the function layer, and a side of the vertical insertion horizontally extends outwardly into the function layer to from a horizontal insertion. The invention provides a TFT array substrate, which adopts a novel inter-layers structure arrangement, which effectively reduces risk of potential mutual detachment between different layers, thereby improving product stability.

8 Claims, 4 Drawing Sheets

(56) References Cited

U.S. PATENT DOCUMENTS

| | | |
|---|---|---|
| 2020/0161570 A1 | 5/2020 | Bai et al. |
| 2020/0201391 A1 | 6/2020 | Bai et al. |
| 2021/0280649 A1* | 9/2021 | Chen ................... H01L 51/56 |

FOREIGN PATENT DOCUMENTS

| | | | |
|---|---|---|---|
| CN | 107706224 A | | 2/2018 |
| CN | 108231839 A | | 6/2018 |
| CN | 108550612 A | * | 9/2018 |
| CN | 109065583 A | | 12/2018 |
| CN | 109065616 A | | 12/2018 |
| CN | 109166862 A | | 1/2019 |

\* cited by examiner

TFT ARRAY SUBSTRATE, FABRICATING METHOD THEREOF, AND DISPLAY PANEL THEREOF

CROSS-REFERENCE TO RELATED APPLICATIONS

This application is the National phase under 35 U.S.C. § 371 of International Application No. PCT/CN2019/111900, filed Oct. 18, 2019, which claims the benefit of and priority to Chinese Patent Application No. 201910663797.6, filed Jul. 23, 2019. The entire contents of these patent applications are hereby incorporated by reference herein.

FIELD OF INVENTION

The present invention relates to a field of display technologies, and in particular, to a TFT array substrate, a method of fabricating the same, and a display panel thereof.

BACKGROUND OF INVENTION

It is known that a thin film transistor (TFT) array substrate is formed by laminating different functional layers to constitute electrical components having different functions, thereby realizing its design function.

The different functional layers are composed of different materials and surfaces in contact with each other are in planar, so that the bonding force between the surfaces of the functional layers that are in contact with each other is not necessarily strong. For example, between a familiar planarization layer (PLN, planarization layer) and an interlayer dielectric layer (ILD, InterLayer Dielectric) included in the function layer, the adhesion between the two contact surfaces is not very strong due to planar surface contact therebetween, there is a certain risk of potential separation between the two, which is what the industry usually calls "peeling".

In this regard, solution adopted by the industry is to add a through hole such that a part of the planarization layer protrudes into the interlayer dielectric layer like a plug structure, even further extends into an insulating layer of the function layer below the interlayer dielectric layer. In this way, the bonding force between the two is enhanced by a deep plug structure, so that peeling problem between the two can be improved to a certain extent.

However, when the TFT array substrate needs to be bent, due to its bent state, the risk of detachment between different layers is significantly increased, and the above-mentioned added plug structure cannot solve the problem well. Instead, there is a problem that the plug structure is more easily extracted from the through hole because of the bending.

Furthermore, when peeling phenomenon between different function layers occurs, the most obvious problem is that the display screen shows an abnormal problem, which causes problems in product stability. Therefore, it is indeed necessary to develop a novel TFT array substrate to overcome drawbacks of the conventional art.

Technical Problem

An aspect of the present invention provides a TFT array substrate that adopts a novel inter-layers structure arrangement, which effectively reduces risk of potential mutual detachment between different layers, thereby improving product stability.

SUMMARY OF INVENTION

Technical Solution

The technical solution adopted by the present invention is as follows.

A thin film transistor (TFT) array substrate including a base layer. The base layer has a function layer disposed on the base layer, and a planarization layer disposed on the function layer. The planarization layer includes a vertical insertion extending into the function layer, and a side of the vertical insertion horizontally extends outwardly into the function layer to from a horizontal insertion.

Furthermore, in different embodiments, both sides of the vertical insertion extend outwardly to respectively from a first horizontal insertion and a second horizontal insertion which are oppositely disposed.

Furthermore, in different embodiments, the function layer includes a metal layer and an insulating layer which are laminated, and the horizontal insertion is disposed in the insulating layer.

Furthermore, in different embodiments, the insulating layer includes a first insulating layer and a second insulating layer disposed on the first insulating layer, and the horizontal insertion is disposed in the first insulating layer.

Furthermore, in different embodiments, the insulating layer includes a first insulating layer and a second insulating layer disposed on the first insulating layer, and the horizontal insertion is disposed in the second insulating layer.

Furthermore, in different embodiments, the insulating layer includes a first insulating layer and a second insulating layer disposed on the first insulating layer, and the horizontal insertion includes a first horizontal insertion and a second horizontal insertion, wherein the first horizontal insertion is disposed in the first insulating layer, and the second horizontal insertion is disposed in the second insulating layer.

Furthermore, in different embodiments, the function layer further includes an interlayer dielectric layer, the planarization layer is disposed on the interlayer dielectric layer, and the horizontal insertion is disposed in the interlayer dielectric layer.

Furthermore, in different embodiments, the function layer includes a metal layer, an insulating layer, and an interlayer dielectric layer which are laminated, wherein the planarization layer is disposed on the interlayer dielectric layer, and the horizontal insertion is disposed in the insulating layer or the interlayer dielectric layer.

Another aspect of the present invention provides a method of fabricating the thin film transistor (TFT) array substrate according to aforementioned TFT array substrate, which includes the steps of:

step S1, providing the base layer and forming the function layer on the base layer, wherein when forming a metal layer in the function layer, an electrode layer and a reserved metal layer at a predetermined position are retained;

step S2, performing a front exposure development of the planarization layer on the function layer, and forming a via hole extending into the function layer, wherein a side of the via hole is in contact with the reserved metal layer; and step S3, removing the reserved metal layer, and performing coating of the planarization layer and filling the via hole and the predetermined position for the reserved metal layer, wherein after the filling is completed, a portion of the planarization layer filled in the via hole is the vertical insertion and a portion of the planarization layer filled in the predetermined position for the reserved metal layer is the horizontal insertion that is in contact with the side of the vertical insertion.

Furthermore, another aspect of the present invention provides a display panel using a TFT array substrate according to the TFT array substrate mentioned in the present invention.

Beneficial Effect

The present invention relates to a TFT array substrate which is provided with a novel insertion structure composed of a vertical insertion in the planarization layer and a horizontal insertion. So that the TFT array substrate does not solely rely on a vertical plug structure, but adds at least one horizontal wedge-shaped structure, by the combination of the two, which makes bonding between the planarization layer and the function layer disposed under the planarization layer more compact, and even in the case of bending, peeling problem between different layers is not easy to occur.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

The technical scheme of a thin film transistor (TFT) array substrate, a method for fabricating the same, and a display panel thereof according to the present invention will be further described in detail below with reference to the accompanying drawings and embodiments.

Figure 1:
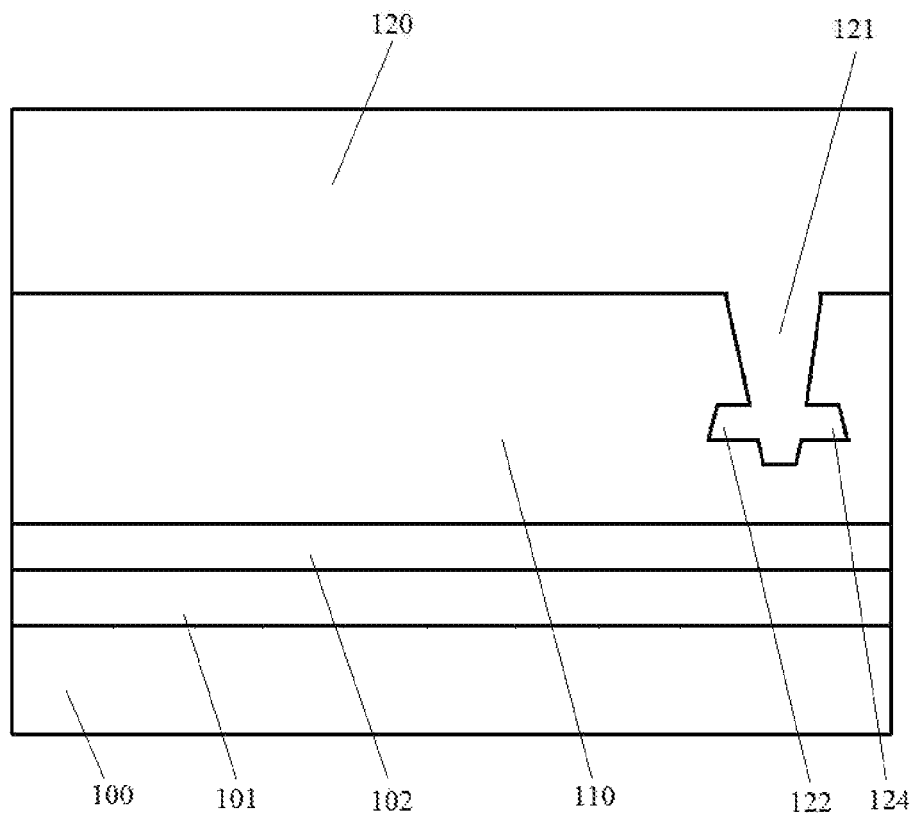
FIG. 1 is a schematic structural view of a TFT array substrate according to an embodiment of the present invention.

Referring to FIG. 1, an embodiment of the present invention provides a TFT array substrate including a base layer 100.

A barrier layer 101, a buffer layer 102, a function layer 110, and a planarization layer 120 are sequentially disposed on the base layer 100. The function layer 110 is a general term for a multi-layer laminated structure, and generally includes a plurality of insulating layers disposed in a layered stack manner. The plurality of insulating layers are interposed with functional metal layers, and in order to highlight focus of the present invention, the stacked structures are collectively referred to a function layer 110, and in the following embodiments, the function layer will be described in an expanded manner.

Furthermore, as shown in FIG. 1, in addition to an inverted trapezoid vertical insertion 121 disposed in the planarization layer 110, a first horizontal insertion portion 122 and a second horizontal insertion portion 124 extending horizontally are also provided on both sides of the inverted trapezoid vertical insertion portion 121, respectively.

The horizontal insertion on left side of the vertical insertion 121 can be defined as the first horizontal insertion 122, and the horizontal insertion on right side thereof can be defined as the second horizontal insertion 124, for convenience of distinction and clear explanation. However, for convenience of description, and not limitation, the first horizontal insertion 122 and the second horizontal insertion 124 are horizontal insertions that perform the same function, and there is no substantial functional difference between the two. The difference is only different in configuration.

In other different embodiments, wherein the horizontal insertion can be only one, or the configurations of the first horizontal insertion 122 and the second horizontal insertion 124 are different, or the first horizontal insertion 122 and the second horizontal insertion 124 are not disposed in the same layer, and so on. For specific implementations, refer to the following description.

Furthermore, in order to ensure effect of conjunction, ends of the horizontal insertions 122, 124 are trapezoidal configurations having a certain inclination. In other embodiments, each end of the horizontal insertion can also be a sawtooth configuration, a wave curve configuration, or the like, which can effectively increase surface contact area between the end and the function layer thereof. Specifically, it can be determined as needed, and is not limited.

Furthermore, another embodiment of the present invention provides a method of fabricating the TFT array substrate according to the present invention, which includes the following steps.

Step S1, providing a base layer 100, and forming a barrier layer 101, a buffer layer 102, and a function layer 110, on the base layer 100, wherein forming a metal layer in the function layer, in addition to an electrode layer, also two reserved metal layers 103, 104 intervally disposed at predetermined position are retained. The completed structure is as shown in FIG. 2, wherein the function layer does not show a specific detail structure, the specific stacked structure that may be implemented can be referred to the following description.

Figure 2:
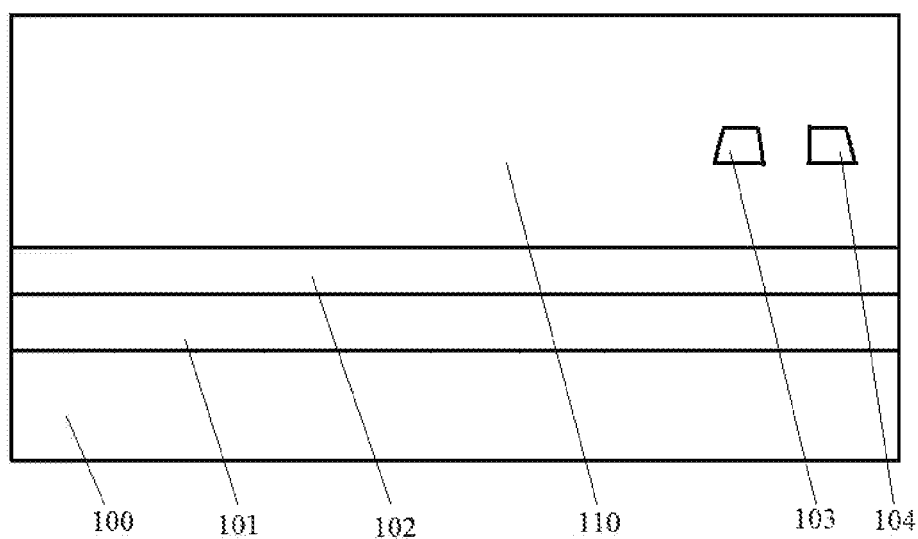
FIG. 2 is a schematic structural view of the TFT array substrate correspondence with completing a step S1 of a method of fabricating the TFT array substrate according to an embodiment of the present invention.

In addition, in other different embodiments, the reserved metal layers 103, 104 may not be intervally disposed in the same layer as shown in FIG. 2, and can also be horizontally spaced apart from each other in different layers, which can be determined as needed, and is not limited. In addition, the exemplary embodiments involved therein can be referred to the following description.

Figure 3:
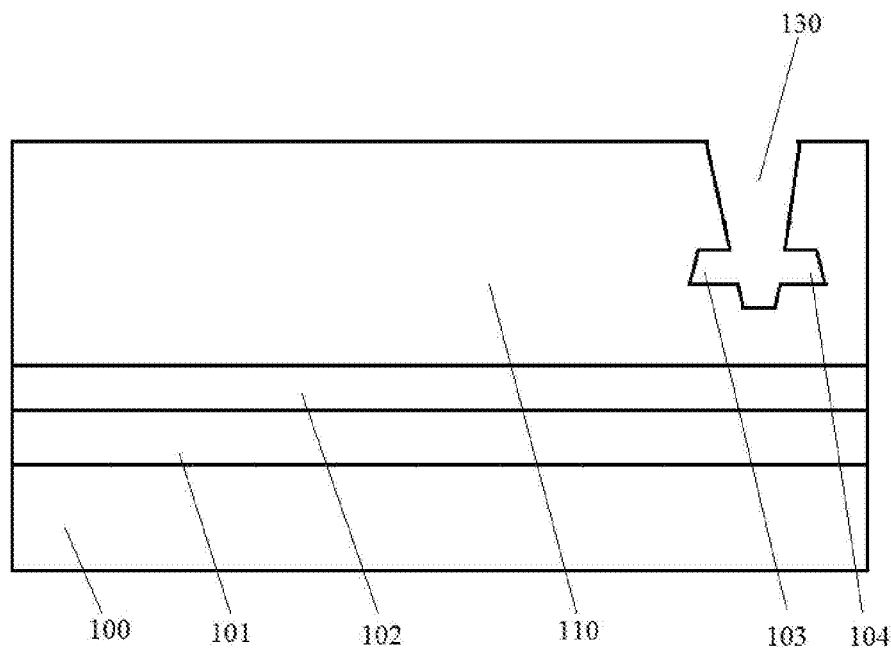
FIG. 3 is a schematic structural view of the TFT array substrate correspondence with completing a step S2 of the method of fabricating the TFT array substrate according to an embodiment of the present invention.

Step S2, performing a front exposure development of the planarization layer 120 on the function layer 110, and etching the via holes 130 extending into the function layer by dry etching, wherein both sides of the via holes 130 are in contact with the reserved metal layers 103, 104, respectively. Referring to illustration after completion is shown in FIG. 3.

Step S3, removing the reserved metal layers 103, 104 by wet etching, and performing coating of the planarization layer 120 and simultaneously filling the via holes 130 and the predetermined positions for the reserved metal layers 103, 104. The completed structure is the structure shown in FIG. 1.

Furthermore, the function layer 110 involved in the above embodiment will be described in detail with reference to the accompanying drawings, and a plurality of implementation structures will be given for the horizontal insertion in the planarization layer 120.

Figure 4:
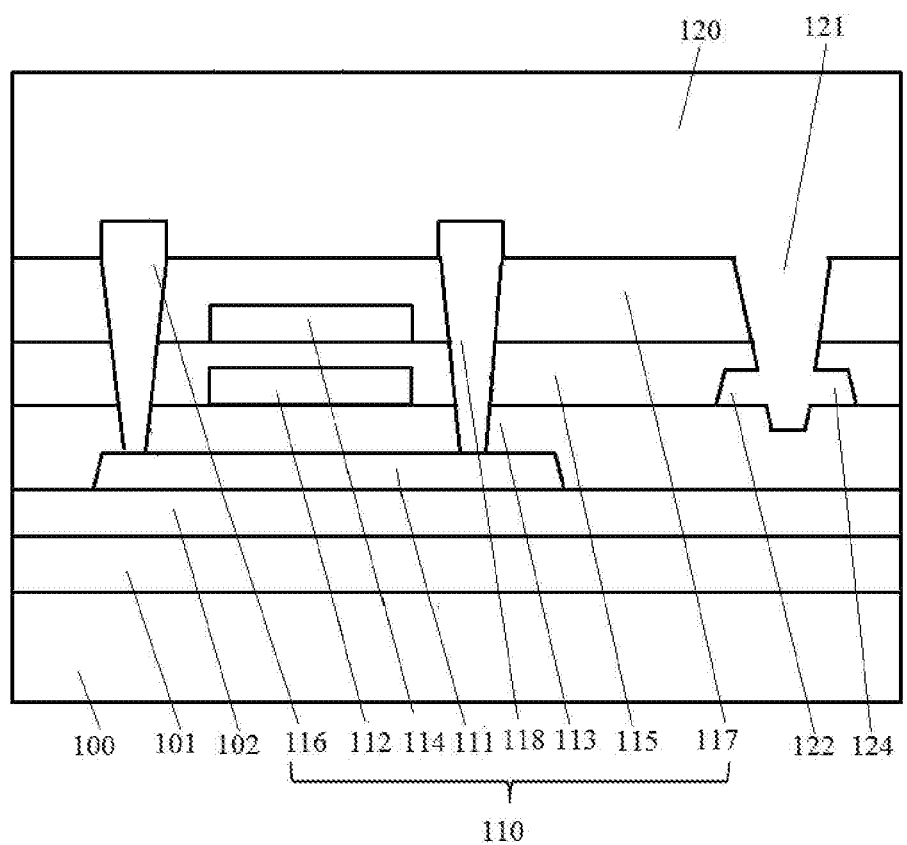
FIG. 4 is a schematic structural view of a TFT array substrate according to another embodiment of the present invention.

Please refer to FIG. 4, which illustrates a structure of a TFT array substrate provided by yet another embodiment of the present invention.

As shown in FIG. 4, the function layer 110 specifically includes an active layer 111, a first gate layer 112, a first insulating layer 113, a second gate layer 114, a second insulating layer 115, source/drain layers 116, 118, and an interlayer dielectric layer 117, which are laminated. It should be clarified that the detailed description of this function layer 110 is merely an example description, and is not limited thereto.

The vertical insertion 121 in the planarization layer 120 has an inverted trapezoidal configuration, a bottom of the vertical insertion extends into the first insulating layer 113, and a first horizontal insertion 122 and a second horizontal insertion 124 respectively disposed at both sides of the vertical insertion 121 are disposed in the same layer of the second insulating layer 115.

Furthermore, in other different embodiments, the first horizontal insertion 122 and the second horizontal insertion 124 disposed at two sides of the vertical insertion 121 can also be disposed in the same layer of the interlayer dielectric layer 117. Or the first horizontal insertion 122 and the second horizontal insertion 124 are disposed in each of the second insulating layer 115 and the interlayer dielectric layer 117, specific structure diagrams can be seen in FIG. 5 and FIG. 6, respectively.

Figure 7:
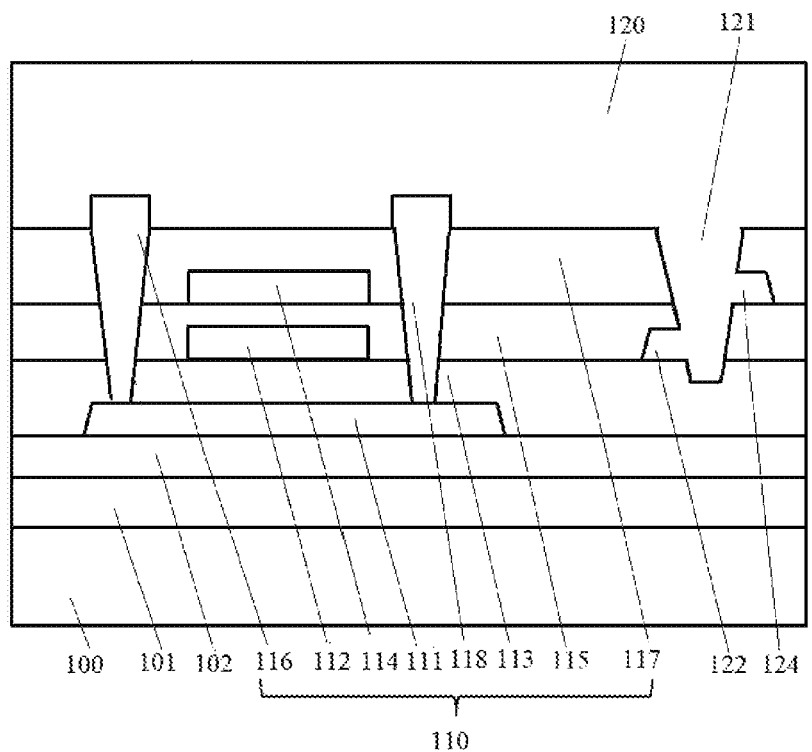
FIG. 7 is a schematic structural view of a TFT array substrate according to yet another embodiment of the present invention.

Furthermore, please refer to FIG. 7, which illustrates a structure of a TFT array substrate provided by yet another embodiment of the present invention.

Figure 5:
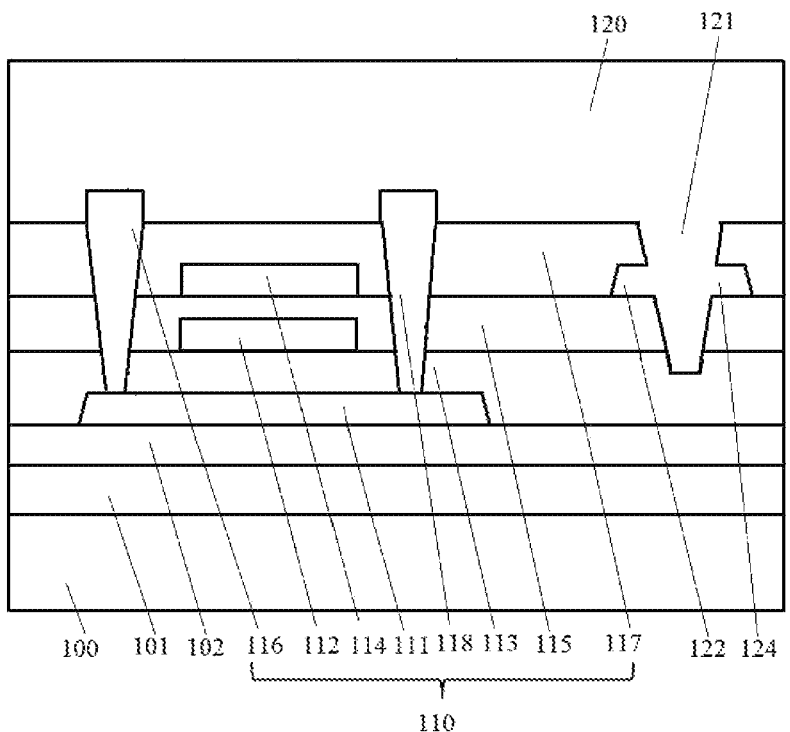
FIG. 5 is a schematic structural view of a TFT array substrate according to yet another embodiment of the present invention.
Figure 6:
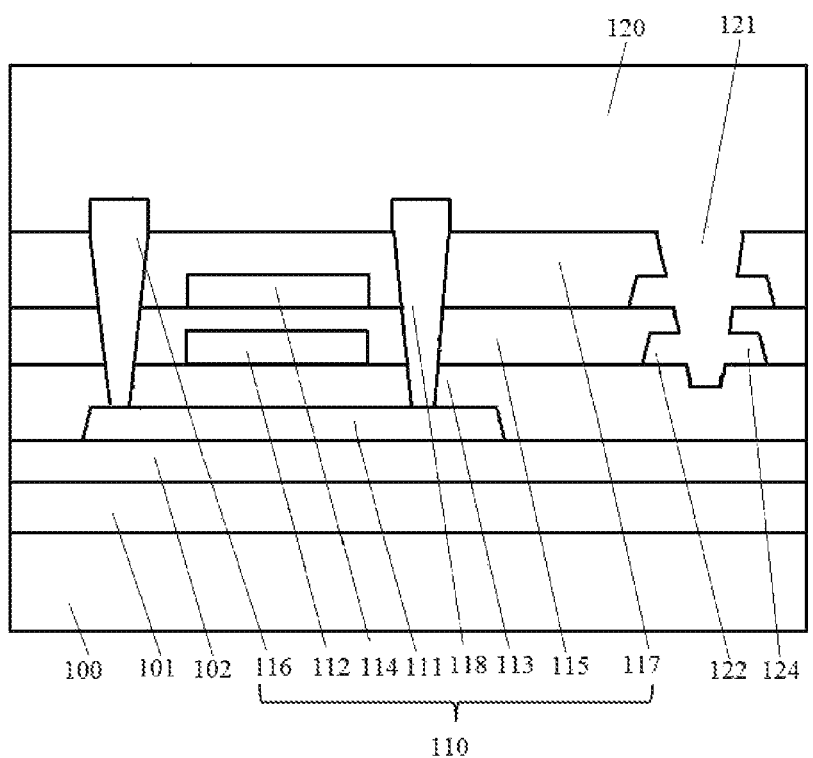
FIG. 6 is a schematic structural view of a TFT array substrate according to yet another embodiment of the present invention.

Meanwhile, the difference from the embodiments shown in FIG. 4, FIG. 5, and FIG. 6 is that the first horizontal insertion 122 and the second horizontal insertion 124 disposed in different layers and arranged in different sides, that is, both insertions are respectively positioned in the second insulating layer 115 and the interlayer dielectric layer 117 on different sides of the vertical insertion portion 121.

Figure 8:
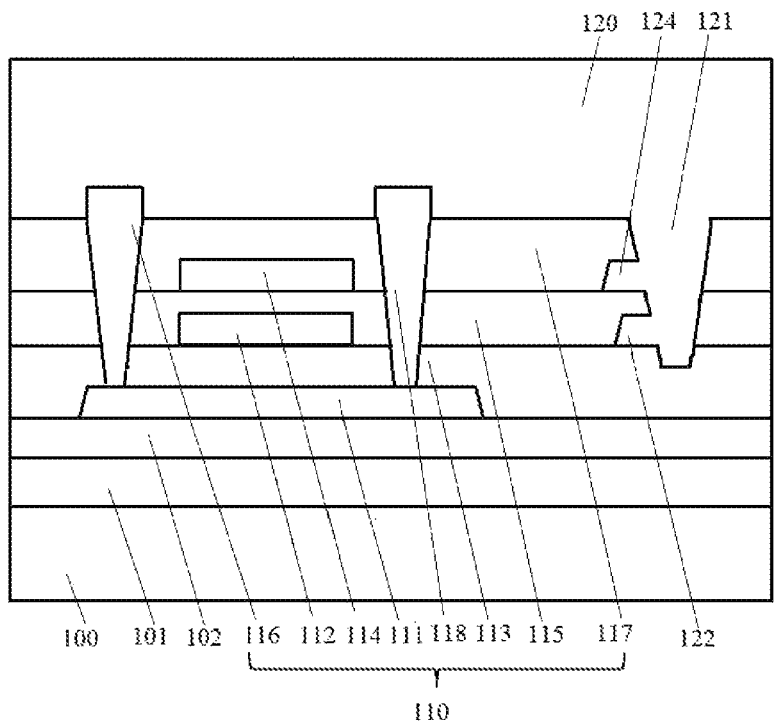
FIG. 8 is a schematic structural view of a TFT array substrate according to yet another embodiment of the present invention.

Furthermore, please refer to FIG. 8, which illustrates a structure of a TFT array substrate provided by yet another embodiment of the present invention.

Meanwhile, the difference from the embodiment shown in FIG. 7 is that the first horizontal insertion 122 and the second horizontal insertion 124 disposed in different layers but arranged in the same side, that is, both insertions are respectively positioned in the second insulating layer 115 and the interlayer dielectric layer 117 on the same sides of the vertical insertion portion 121.

Furthermore, another aspect of the present invention provides a display panel using a TFT array substrate according to the TFT array substrate disclosed in the present invention.

The present invention relates to a TFT array substrate which is provided with a novel insertion structure composed of a vertical insertion in the planarization layer and a horizontal insertion. So that the TFT array substrate does not solely rely on a vertical plug structure, but adds at least one horizontal wedge-shaped structure, by the combination of the two, which makes bonding between the planarization layer and the function layer disposed under the planarization layer more compact, and even in the case of bending, peeling problem between different layers is not easy to occur.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A thin film transistor (TFT) array substrate comprising:
a base layer having a function layer disposed on the base layer, and a planarization layer disposed on the function layer,
wherein the planarization layer comprises a vertical insertion extending into the function layer, a side of the vertical insertion horizontally extends outwardly into the function layer to form a horizontal insertion, and the horizontal insertion horizontally protrudes from a sidewall of the vertical insertion above the horizontal insertion;
wherein the function layer comprises a metal layer and an insulating layer which are laminated, and the horizontal insertion is disposed in the insulating layer; and
wherein the insulating layer comprises a first insulating layer and a second insulating layer disposed on the first insulating layer, and the horizontal insertion comprises a first horizontal insertion and a second horizontal insertion, wherein the first horizontal insertion is disposed in the first insulating layer, and the second horizontal insertion is disposed in the second insulating layer.

2. The TFT array substrate according to claim 1, wherein both sides of the vertical insertion extend outwardly to respectively form a first horizontal insertion and a second horizontal insertion which pertain to the horizontal insertion and are oppositely disposed.

3. The TFT array substrate according to claim 1, wherein the insulating layer comprises a first insulating layer and a second insulating layer disposed on the first insulating layer, and the horizontal insertion is disposed in the first insulating layer.

4. The TFT array substrate according to claim 1, wherein the insulating layer comprises a first insulating layer and a second insulating layer disposed on the first insulating layer, and the horizontal insertion is disposed in the second insulating layer.

5. The TFT array substrate according to claim 1, wherein the function layer further comprises an interlayer dielectric layer, the planarization layer is disposed on the interlayer dielectric layer, and the horizontal insertion is disposed in the interlayer dielectric layer.

6. The TFT array substrate according to claim 1, wherein the function layer comprises a metal layer, an insulating layer, and an interlayer dielectric layer which are laminated, wherein the planarization layer is disposed on the interlayer dielectric layer, and the horizontal insertion is disposed in the insulating layer or the interlayer dielectric layer.

7. A display panel comprising the TFT array substrate according to claim 1.

8. A method of fabricating the thin film transistor (TFT) array substrate according to claim 1, comprising the steps of:
- step S1, providing the base layer and forming the function layer on the base layer, wherein when forming a metal layer in the function layer, an electrode layer and a reserved metal layer at a predetermined position are retained in the function layer;
- step S2, performing a front exposure development on the function layer, and forming a via hole extending into the function layer, wherein a side of the via hole is in contact with the reserved metal layer; and
- step S3, removing the reserved metal layer, and performing coating of the planarization layer, the planarization layer filling the via hole and the predetermined position for the reserved metal layer, wherein after the filling is completed, a portion of the planarization layer filled in the via hole is the vertical insertion and a portion of the planarization layer filled in the predetermined position for the reserved metal layer is the horizontal insertion that is in contact with the side of the vertical insertion.

* * * * *

UNITED STATES PATENT AND TRADEMARK OFFICE
CERTIFICATE OF CORRECTION

| | |
|---|---|
| PATENT NO. | : 11,398,506 B2 |
| APPLICATION NO. | : 16/624789 |
| DATED | : July 26, 2022 |
| INVENTOR(S) | : Qian Huang |

Page 1 of 1

It is certified that error appears in the above-identified patent and that said Letters Patent is hereby corrected as shown below:

On the Title Page

Item (73) Assignee:
Change "WUHAN CHINA STAR OPTOELECTRONICS TECHNOLOGY CO., LTD." to
--WUHAN CHINA STAR OPTOELECTRONICS SEMICONDUCTOR DISPLAY TECHNOLOGY CO., LTD.--

Signed and Sealed this
Twenty-fifth Day of November, 2025

John A. Squires
*Director of the United States Patent and Trademark Office*